United States Patent
Bunker et al.

(10) Patent No.: US 9,200,521 B2
(45) Date of Patent: Dec. 1, 2015

(54) COMPONENTS WITH MICRO COOLED COATING LAYER AND METHODS OF MANUFACTURE

(71) Applicant: General Electric Company, Schenectady, NY (US)

(72) Inventors: Ronald Scott Bunker, Waterford, NY (US); Scott Andrew Weaver, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 338 days.

(21) Appl. No.: 13/663,967

(22) Filed: Oct. 30, 2012

(65) Prior Publication Data

US 2014/0120274 A1    May 1, 2014

(51) Int. Cl.
*F01D 5/18* (2006.01)
*B05D 3/06* (2006.01)
*B05D 3/12* (2006.01)
(Continued)

(52) U.S. Cl.
CPC .. *F01D 5/18* (2013.01); *B05D 3/06* (2013.01); *B05D 3/12* (2013.01); *C23C 4/085* (2013.01); *C23C 4/18* (2013.01); *C23C 14/5886* (2013.01); *F01D 5/184* (2013.01); *F01D 5/187* (2013.01); *F01D 5/288* (2013.01);
(Continued)

(58) Field of Classification Search
CPC .............. C21D 7/06; C21D 7/08; B05D 3/06; B05D 3/12; F01D 5/18; C23C 14/5886
USPC ...................... 72/46, 53, 341; 29/90.01, 90.7; 427/289, 290, 327; 416/9 R, 241 R
See application file for complete search history.

(56) References Cited

U.S. PATENT DOCUMENTS

| 3,963,368 A | 6/1976 | Emmerson |
| 4,487,550 A | 12/1984 | Horvath et al. |

(Continued)

FOREIGN PATENT DOCUMENTS

| EP | 1387040 B1 | 4/2004 |
| EP | 2503099 A2 | 9/2012 |
| EP | 2573320 A2 | 3/2013 |

OTHER PUBLICATIONS

Bunker, Ronald Scott; "Components With Cooling Channels and Methods of Manufacture"; Pending U.S. Appl. No. 13/242,179, filed Sep. 23, 2011; 27 Pages.

(Continued)

*Primary Examiner* — Shelley Self
*Assistant Examiner* — Pradeep C Battula
(74) *Attorney, Agent, or Firm* — Ann M. Agosti

(57) ABSTRACT

A manufacturing method includes providing a substrate with an outer surface and at least one interior space, applying a coating on a portion of the substrate and forming one or more grooves in the coating, wherein each groove extends at least partially along the coating. The method further includes processing at least a portion of the surface of the coating to plastically deform the coating in the vicinity of the top of a respective groove. An additional coating is applied over at least a portion of the surface of the coating. A component is disclosed and includes a substrate, a coating disposed on at least a portion of the substrate, and defining one or more grooves therein, and an additional coating disposed over at least a portion of the coating. The substrate, the coating and the additional coating together define one or more channels for cooling the component.

17 Claims, 4 Drawing Sheets

Figure 1:
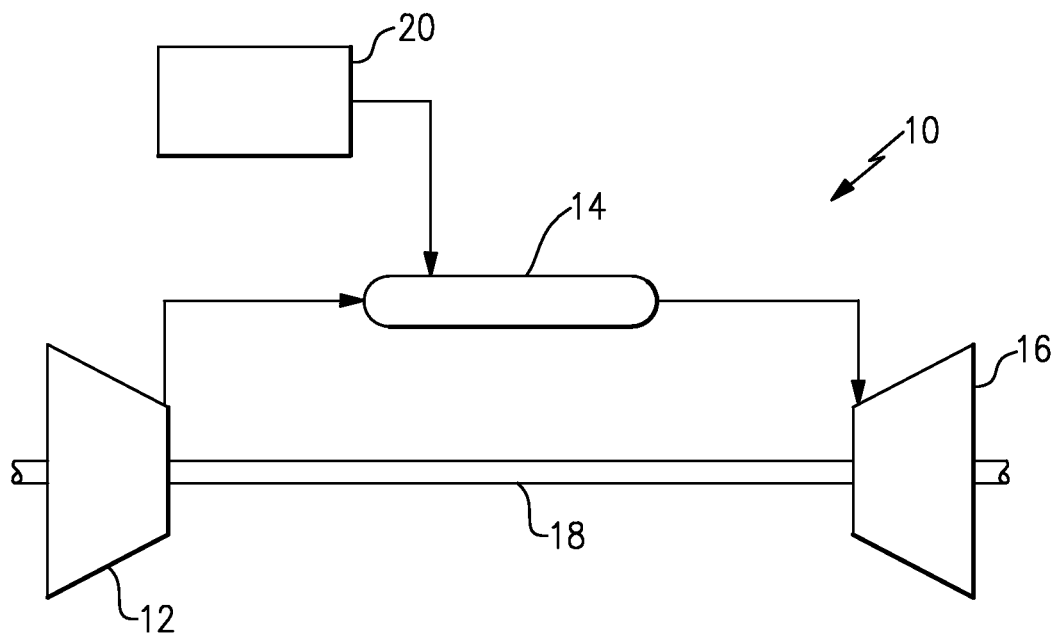

(51) Int. Cl.
*C23C 4/18* (2006.01)
*F01D 5/28* (2006.01)
*C23C 14/58* (2006.01)
*C23C 4/08* (2006.01)

(52) U.S. Cl.
CPC ........ *F05D 2260/204* (2013.01); *Y02T 50/672* (2013.01); *Y02T 50/676* (2013.01); *Y10T 428/13* (2015.01)

(56) References Cited

U.S. PATENT DOCUMENTS

| | | | |
|---|---|---|---|
| 4,893,987 | A | 1/1990 | Lee et al. |
| 5,564,902 | A | 10/1996 | Tomita |
| 5,626,462 | A | 5/1997 | Jackson et al. |
| 5,640,767 | A | 6/1997 | Jackson et al. |
| 5,660,523 | A | 8/1997 | Lee |
| 5,875,549 | A | 3/1999 | McKinley |
| 5,941,686 | A * | 8/1999 | Gupta et al. ............... 416/241 R |
| 6,059,530 | A | 5/2000 | Lee |
| 6,086,328 | A | 7/2000 | Lee |
| 6,164,914 | A | 12/2000 | Correia et al. |
| 6,190,129 | B1 | 2/2001 | Mayer et al. |
| 6,214,248 | B1 | 4/2001 | Browning et al. |
| 6,231,307 | B1 | 5/2001 | Correia |
| 6,234,755 | B1 | 5/2001 | Bunker et al. |
| 6,321,449 | B2 | 11/2001 | Zhao et al. |
| 6,368,060 | B1 | 4/2002 | Fehrenbach et al. |
| 6,383,602 | B1 | 5/2002 | Fric et al. |
| 6,403,165 | B1 | 6/2002 | Grylls et al. |
| 6,405,435 | B1 | 6/2002 | Konter et al. |
| 6,412,541 | B2 | 7/2002 | Roesler et al. |
| 6,427,327 | B1 | 8/2002 | Bunker |
| 6,471,881 | B1 | 10/2002 | Chai et al. |
| 6,488,238 | B1 | 12/2002 | Battisti |
| 6,494,678 | B1 * | 12/2002 | Bunker ........................ 416/97 R |
| 6,502,441 | B1 * | 1/2003 | Suzuki et al. ...................... 72/53 |
| 6,551,061 | B2 | 4/2003 | Darolia et al. |
| 6,582,194 | B1 | 6/2003 | Birkner et al. |
| 6,602,053 | B2 | 8/2003 | Subramanian et al. |
| 6,617,003 | B1 | 9/2003 | Lee et al. |
| 6,905,302 | B2 | 6/2005 | Lee et al. |
| 6,921,014 | B2 | 7/2005 | Hasz et al. |
| 7,014,923 | B2 | 3/2006 | Schnell et al. |
| 7,094,475 | B2 | 8/2006 | Schnell et al. |
| 7,186,167 | B2 | 3/2007 | Joslin |
| 7,216,428 | B2 | 5/2007 | Memmen et al. |
| 7,302,990 | B2 | 12/2007 | Bunker et al. |
| 7,744,348 | B2 | 6/2010 | Bezencon et al. |
| 7,766,617 | B1 | 8/2010 | Liang |
| 7,775,768 | B2 | 8/2010 | Devore et al. |
| 7,967,924 | B2 * | 6/2011 | Groh et al. ................... 29/889.2 |
| 8,147,196 | B2 | 4/2012 | Campbell et al. |
| 8,601,691 | B2 * | 12/2013 | Rebak et al. ................... 427/290 |
| 8,727,727 | B2 * | 5/2014 | Bunker et al. ............. 416/97 R |
| 8,753,071 | B2 * | 6/2014 | Bunker ........................ 416/97 R |
| 2002/0141868 | A1 | 10/2002 | Lee et al. |
| 2002/0141869 | A1 | 10/2002 | Lee et al. |
| 2002/0182074 | A1 | 12/2002 | Bunker |
| 2002/0197160 | A1 | 12/2002 | Liang |
| 2003/0118444 | A1 | 6/2003 | Lee et al. |
| 2004/0096328 | A1 | 5/2004 | Soechting et al. |
| 2006/0099080 | A1 * | 5/2006 | Lee et al. ................... 416/241 R |
| 2006/0153680 | A1 | 7/2006 | Liang |
| 2010/0080688 | A1 | 4/2010 | Bezencon et al. |
| 2010/0143655 | A1 * | 6/2010 | Rosenzweig et al. ...... 416/241 R |
| 2010/0158700 | A1 * | 6/2010 | Poon et al. ................... 416/97 R |
| 2012/0148769 | A1 | 6/2012 | Bunker et al. |
| 2012/0207953 | A1 * | 8/2012 | Bunker ........................ 427/290 |
| 2013/0101761 | A1 * | 4/2013 | Bunker et al. ...................... 72/53 |

OTHER PUBLICATIONS

Bunker, Ronald Scott; "Components With Cooling Channels and Methods of Manufacture"; Pending U.S. Appl. No. 13/595,120, filed Aug. 27, 2012; 32 Pages.

EP Search Report and Written Opinion dated Feb. 19, 2014 issued in connection with corresponding EP Patent Application No. 13190089.6.

Hyams et al., "A Detailed Analysis of film Cooling Physics: Part III—Streamwise Injection With Shaped Holes," Journal of Turbomachinery, vol. 122, Issue 1, Jan. 2000, pp. 122-132.

Wei et al., "Curved Electrode and Electrochemical Machining Method and Assembly Employing the Same," U.S. Appl. No. 12/562,528, filed Sep. 18, 2009.

Zhang et al., Process and System for Forming Shaped Air Holes, U.S. Appl. No. 12/697,005, filed Jan. 29, 2010.

Lacy et al., "Hot Gas Path Component Cooling System," U.S. Appl. No. 12/765,372, filed Apr. 22, 2010.

Lacy et a., "Articles Which Include Chevron Film Cooling Holes, and Related Processes," U.S. Appl. No. 12/790,675, filed May 28, 2010.

Lambie et al., "An Overview on Micro-Meso Manufacturing Techniques for Micro-Heat Exchangers for Turbine Blade Cooling," International Journal Manufacturing Research, vol. 3, No. 1, 2008, pp. 3-26.

Bunker et al., "Components With Re-Entrant Shaped Cooling Channels and Methods of Manufacture," U.S. Appl. No. 12/943,624, filed Nov. 10, 2010.

Bunker et al., "Component and Methods of Fabricating and Coating a Component," U.S. Appl. No. 12/943,646, filed Nov. 10, 2010.

Bunker et al., "Method of Fabricating a Component Using a Fugitive Coating," U.S. Appl. No. 12/943,563, filed Nov. 10, 2010.

Bunker et al., "Components With Cooling Channels and Methods of Manufacture," U.S. Appl. No. 12/965,083, filed Dec. 10, 2010.

Bunker et al., "Method of Fabricating a Component Using a Two-Layer Structural Coating," U.S. Appl. No. 12/996,101, filed Dec. 13, 2010.

Bunker et al., "Turbine Components With Cooling Features and Methods of Manufacturing the Same," U.S. Appl. No. 12/953,177, filed Nov. 23, 2010.

Bunker, "Components With Cooling Channels and Methods of Manufacture," U.S. Appl. No. 13/026,595, filed Feb. 14, 2011.

Rebak et al., "Methods of Fabricating a Coated Component Using Multiple Types of Fillers," U.S. Appl. No. 13/083,701, filed Apr. 11, 2011.

Bunker et al., "Components With Cooling Channels Formed in Coating and Methods of Manufacture", U.S. Appl. No. 13/052,415, filed Mar. 21, 2011.

Rebak et al., "Component and Methods of Fabricating a Coated Component Using Multiple Types of Fillers," U.S. Appl. No. 13/095,129, filed Apr. 27, 2011.

Bunker, "Components With Cooling Channels and Methods of Manufacture", U.S. Appl. No. 13/168,144, filed Jun. 24, 2011.

Bunker et al., "Components With Cooling Channels and Methods of Manufacture", U.S. Appl. No. 13/210,697, filed Aug. 16, 2011.

Bunker, "Repair Methods for Cooled Components", U.S. Appl. No. 13/267,617, filed Oct. 6, 2011.

Bunker et al., Components With Laser Cladding and Methods of Manufacture, U.S. Appl. No. 13/278,816, filed Oct. 21, 2011.

Bunker, "Components With Microchannel Cooling", U.S. Appl. No. 13/326,540, filed Dec. 15, 2011.

Bunker, "Components With Microchannel Cooling", U.S. Appl. No. 13/448,469, filed Apr. 17, 2012.

Bunker, "Components With Microchannel Cooled Platforms and Fillets and Methods of Manufacture", U.S. Appl. No. 13/478,517, filed May 23, 2012.

Bunker et al., "Components With Cooling Channels and Methods of Manufacture", U.S. Appl. No. 13/595,120, filed Aug. 27, 2012.

Bancheri et al., "Method for Removal of Cores From Niobium-Based Part", U.S. Appl. No. 11/276,002, filed Feb. 9, 2006.

Bonini et al., "Methods of Forming Cooling Channels Using Backstrike Protection", U.S. Appl. No. 13/628,204, filed Sep. 27, 2012.

Bunker"Micro-Channel Coating Deposition System and Method for Using the Same ", U.S. Appl. No. 13/627,158, filed Sep. 26, 2012.

Bunker, "Method of Making Surface Cooling Channels on a Component Using Lithographic Molding Techniques ", U.S. Appl. No. 13/650,320, filed Oct. 12, 2012.

* cited by examiner

COMPONENTS WITH MICRO COOLED COATING LAYER AND METHODS OF MANUFACTURE

BACKGROUND

The disclosure relates generally to gas turbine engines, and, more specifically, to micro-channel cooling therein.

In a gas turbine engine, air is pressurized in a compressor and mixed with fuel in a combustor for generating hot combustion gases. Energy is extracted from the gases in a high pressure turbine (HPT), which powers the compressor, and in a low pressure turbine (LPT), which powers a fan in a turbofan aircraft engine application, or powers an external shaft for marine and industrial applications.

Engine efficiency increases with temperature of combustion gases. However, the combustion gases heat the various components along their flowpath, which in turn requires cooling thereof to achieve an acceptably long engine lifetime. Typically, the hot gas path components are cooled by bleeding air from the compressor. This cooling process reduces engine efficiency, as the bled air is not used in the combustion process.

Gas turbine engine cooling art is mature and includes numerous patents for various aspects of cooling circuits and features in the various hot gas path components. For example, the combustor includes radially outer and inner liners, which require cooling during operation. Turbine nozzles include hollow vanes supported between outer and inner bands, which also require cooling. Turbine rotor blades are hollow and typically include cooling circuits therein, with the blades being surrounded by turbine shrouds, which also require cooling. The hot combustion gases are discharged through an exhaust which may also be lined and suitably cooled.

In all of these exemplary gas turbine engine components, thin walls of high strength superalloy metals are typically used to reduce component weight and minimize the need for cooling thereof. Various cooling circuits and features are tailored for these individual components in their corresponding environments in the engine. For example, a series of internal cooling passages, or serpentines, may be formed in a hot gas path component. A cooling fluid may be provided to the serpentines from a plenum, and the cooling fluid may flow through the passages, cooling the hot gas path component substrate and any associated coatings. However, this cooling strategy typically results in comparatively inefficient heat transfer and non-uniform component temperature profiles.

Employing micro-channel cooling techniques has the potential to significantly reduce cooling requirements. Micro-channel cooling places the cooling as close as possible to the heat flux source, thus reducing the temperature difference between the hot side and cold side of the load bearing substrate material for a given heat transfer rate. However, current techniques provide for the forming of one or more grooves within a substrate layer with a subsequent application of one or more coating layers to bridge the one or more grooves and define the micro-channels. In many instances, forming the microchannels typically requires specialized techniques, such as, the use of sacrificial fillers, re-entrant grooves, angular deposition techniques, or the like. The use of sacrificial fillers keeps the coating from being deposited within the microchannels while supporting the coating during deposition. Subsequent to deposition of the coating system, the sacrificial filler (fugitive) material is removed. The filling of the channels with a fugitive material, and the later removal of that material presents potential problems for current micro-channel processing techniques. Removal of the sacrificial filler involves potentially damaging processes of leaching etching, or vaporization and typically requires long times. Residual filler material is also a concern. Other micro-channel coating deposition techniques include the fabrication of re-entrant grooves, in which a groove opening at the surface is small enough that the coating particles form a bridge with little or no deposition being deposited inside the groove, and thus within the formed micro-channel. In addition, angular deposition techniques have been utilized for the coating deposition thereby decreasing the line-of-sight into the channel opening. These techniques while providing for the deposition of the coating layer may require complex machining techniques, strict tolerances, and may inadvertently allow unwanted coating particles to be deposited into the micro-channels or channel openings.

It would therefore be desirable to provide a method for forming cooling channels in hot gas path components that provide for reduced fabrication time and techniques.

BRIEF DESCRIPTION

One aspect of the present disclosure resides in a manufacturing method that includes providing a substrate with an outer surface and at least one interior space; applying a coating on at least a portion of the substrate; forming one or more grooves in the coating wherein each groove extends at least partially along the coating; processing at least a portion of a surface of the coating so as to plastically deform the coating at least in a vicinity of the top of a respective groove, such that a gap across a top of the groove is reduced; and applying one or more additional coatings over at least a portion of the surface of the coating, wherein the substrate, the coating and the additional coating define one or more channels for cooling a component.

Another aspect of the present disclosure resides in a manufacturing method that includes providing a substrate with an outer surface and at least one interior space; applying a structural coating on at least a portion of the substrate; forming one or more grooves in the coating wherein each groove extends at least partially along the coating; processing at least a portion of a surface of the coating so as to plastically deform the coating at least in a vicinity of the top of a respective groove and facet the surface of the structural coating in a vicinity of the groove, such that a gap across a top of the groove is reduced; and applying one or more additional coatings over at least a portion of the surface of the coating, wherein the substrate, the coating and the additional coating define one or more channels for cooling a component.

Yet another aspect of the present disclosure resides in a component that includes a substrate comprising an outer surface and an inner surface, a coating disposed on at least a portion of the substrate and an additional coating disposed over at least a portion of the coating. The inner surface of the substrate defines at least one interior space. The coating defines one or more grooves therein and wherein each groove extends at least partially along the outer surface of the coating and has a base and a top. The surface of the coating is faceted in a vicinity of the respective groove. One or more supply holes are formed through the base of a respective groove and the substrate, to connect the groove in fluid communication with the supply respective interior space. The substrate, the coating and the additional coating together define one or more channels for cooling the component.

Various refinements of the features noted above exist in relation to the various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. Again, the brief summary presented above is intended only to familiarize the reader with certain aspects and contexts of the present disclosure without limitation to the claimed subject matter.

DRAWINGS

Figure 2:
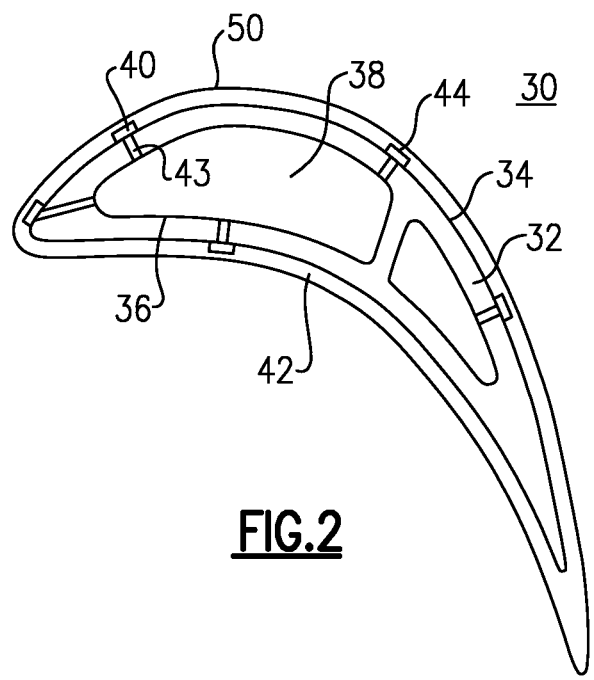
Figure 3:
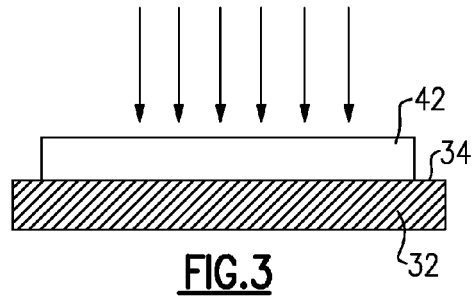
Figure 6:
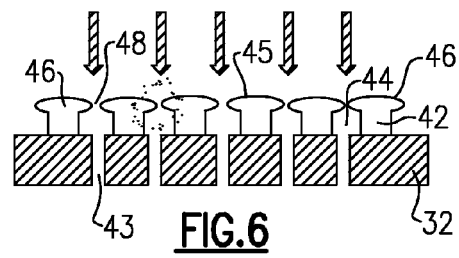
Figure 4:
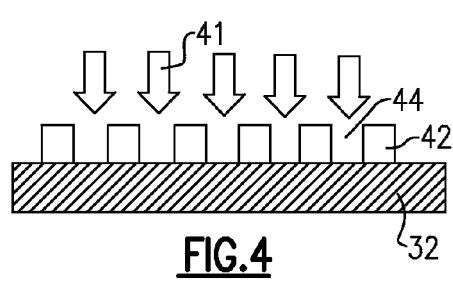
Figure 7:
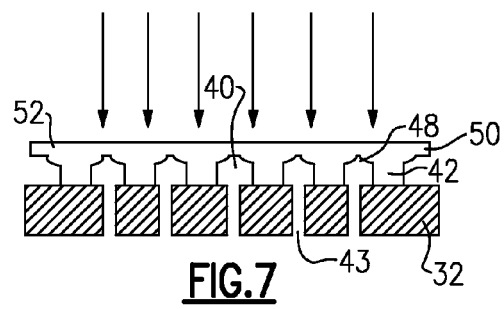
Figure 5A:
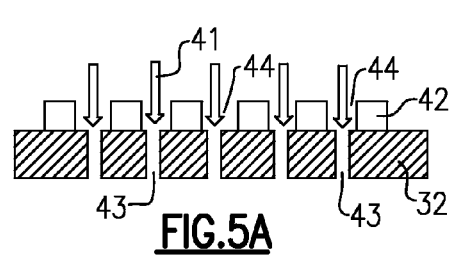
Figure 8A:
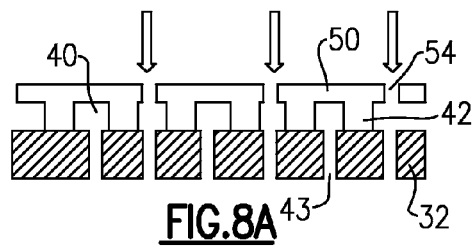
Figure 5B:
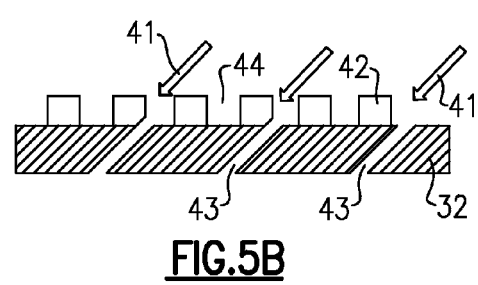
Figure 8B:
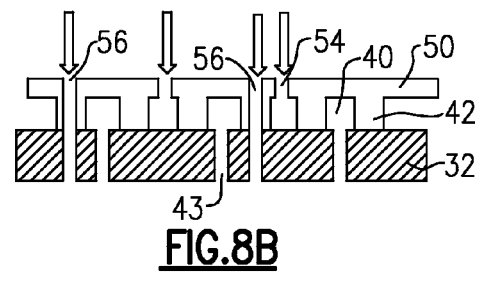
Figure 9:
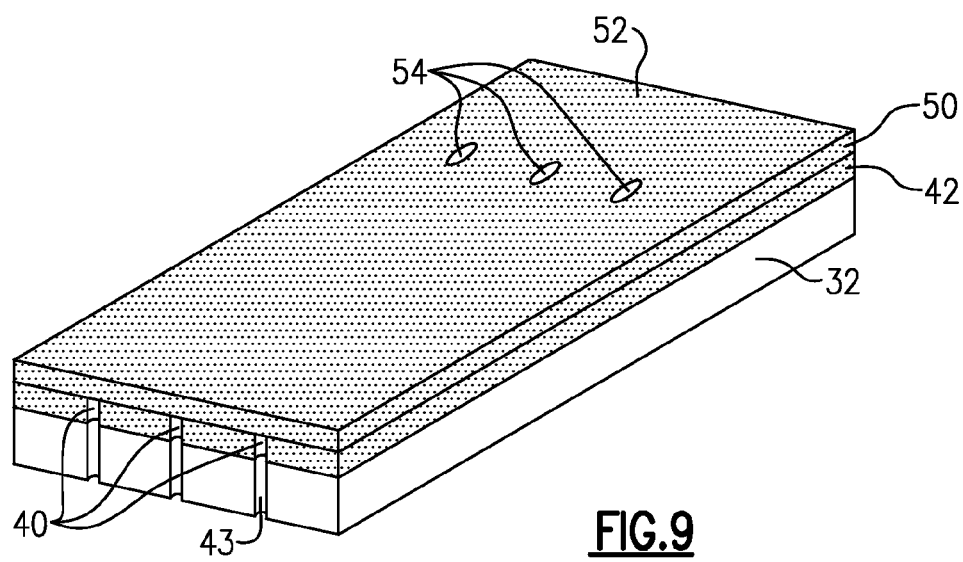
Figure 10:
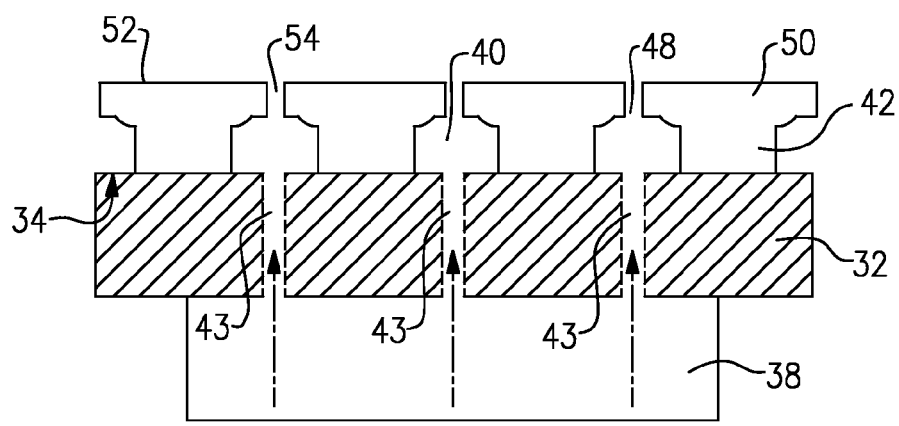
Figure 11:
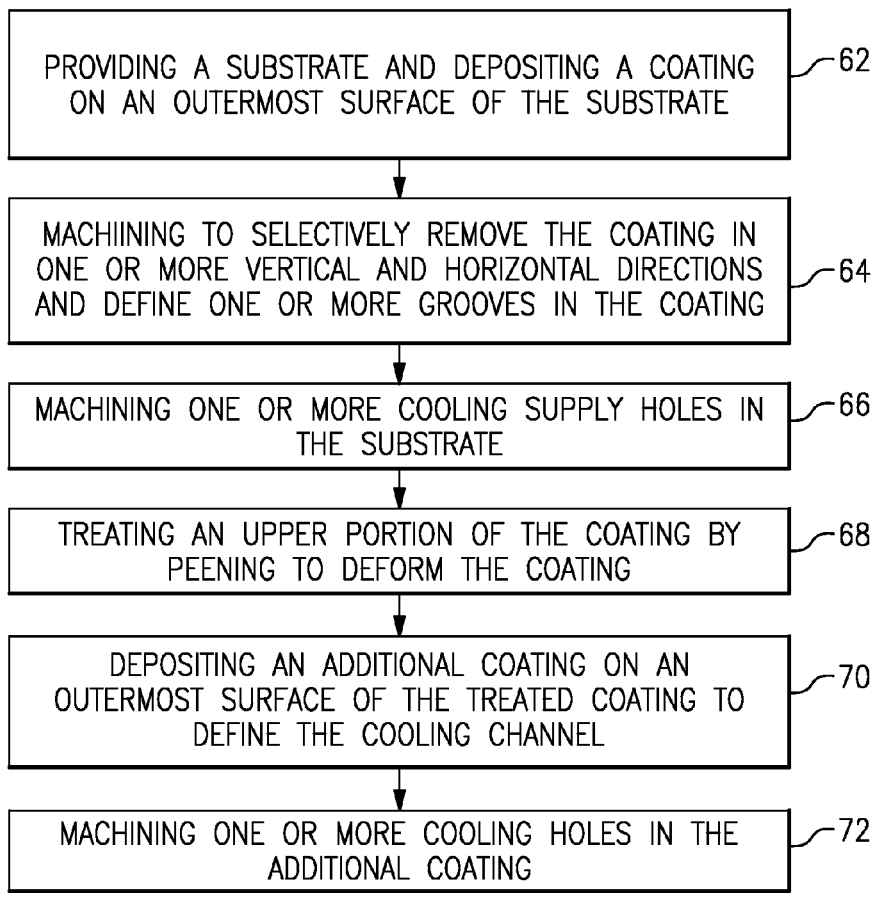

These and other features, aspects, and advantages of the present disclosure will become better understood when the following detailed description is read with reference to the accompanying drawings in which like characters represent like parts throughout the drawings, wherein:

FIG. 1 is a schematic illustration of a gas turbine system according to one or more embodiments shown or described herein FIG. 2 is a schematic cross-section of an example airfoil configuration with cooling channels, according to one or more embodiments shown or described herein;

FIG. 3 schematically depicts a step in a method disclosed herein including the deposition of a coating layer on a substrate according to one or more embodiments shown or described herein;

FIG. 4 schematically depicts a step in a method disclosed herein including machining the coating layer to define one or more grooves according to one or more embodiments shown or described herein;

FIG. 5A schematically depicts a step in a method disclosed herein including forming one or more cooling supply holes according to one or more embodiments shown or described herein;

FIG. 5B schematically depicts an alternate embodiment of a step in a method disclosed herein including forming one or more cooling supply holes according to one or more embodiments shown or described herein;

FIG. 6 schematically depicts a step in a method disclosed herein including a surface treatment that introduces irregularities in the treated surface according to one or more embodiments shown or described herein;

FIG. 7 schematically depicts a step in a method disclosed herein including depositing a coating on the treated surface according to one or more embodiments shown or described herein;

FIG. 8A schematically depicts a step in a method disclosed herein including forming one or more cooling holes according to one or more embodiments shown or described herein;

FIG. 8B schematically depicts an alternate embodiment of a step in a method disclosed herein including forming one or more cooling holes according to one or more embodiments shown or described herein;

FIG. 9 schematically depicts, in perspective view, three example micro-channels that extend partially within a coating layer and convey coolant to respective film cooling holes according to one or more embodiments shown or described herein;

FIG. 10 is a cross-sectional view of the one or more cooling channels of FIG. 9 with the opening size reduced after a surface treatment and deposition of an additional coating material according to one or more embodiments shown or described herein; and FIG. 11 is a flow chart depicting one implementation of a method of making a component including surface cooling channels according to one or more embodiments shown or described herein.

DETAILED DESCRIPTION

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The modifier "about" used in connection with a quantity is inclusive of the stated value, and has the meaning dictated by context, (e.g., includes the degree of error associated with measurement of the particular quantity). In addition, the term "combination" is inclusive of blends, mixtures, alloys, reaction products, and the like.

Moreover, in this specification, the suffix "(s)" is usually intended to include both the singular and the plural of the term that it modifies, thereby including one or more of that term (e.g., "the passage hole" may include one or more passage holes, unless otherwise specified). Reference throughout the specification to "one embodiment," "another embodiment," "an embodiment," and so forth, means that a particular element (e.g., feature, structure, and/or characteristic) described in connection with the embodiment is included in at least one embodiment described herein, and may or may not be present in other embodiments. Similarly, reference to "a particular configuration" means that a particular element (e.g., feature, structure, and/or characteristic) described in connection with the configuration is included in at least one configuration described herein, and may or may not be present in other configurations. In addition, it is to be understood that the described inventive features may be combined in any suitable manner in the various embodiments and configurations.

FIG. 1 is a schematic diagram of a gas turbine system 10. The system 10 may include one or more compressors 12, combustors 14, turbines 16, and fuel nozzles 20. The compressor 12 and turbine 16 may be coupled by one or more shafts 18. The shaft 18 may be a single shaft or multiple shaft segments coupled together to form shaft 18.

The gas turbine system 10 may include a number of hot gas path components. A hot gas path component is any component of the system 10 that is at least partially exposed to a flow of high temperature gas through the system 10. For example, bucket assemblies (also known as blades or blade assemblies), nozzle assemblies (also known as vanes or vane assemblies), shroud assemblies, transition pieces, retaining rings, and turbine exhaust components are all hot gas path components. However, it should be understood that the hot gas path component of the present disclosure is not limited to the above examples, but may be any component that is at least partially exposed to a flow of high temperature gas. Further, it should be understood that the hot gas path component of the present disclosure is not limited to components in gas turbine systems 10, but may be any piece of machinery or component thereof that may be exposed to high temperature flows.

When a hot gas path component is exposed to a hot gas flow, the hot gas path component is heated by the hot gas flow and may reach a temperature at which the hot gas path component is substantially degraded or fails. Thus, in order to allow system 10 to operate with hot gas flow at a high temperature, as required to achieve the desired efficiency, performance and/or life of the system 10, a cooling system for the hot gas path component is needed.

In general, the cooling system of the present disclosure includes a series of small channels, or micro-channels, formed in a protective coating layer of the hot gas path component. The hot gas path component may include one or more grooves formed in the coating layer and an additional coating layer to bridge there over the one or more, and form the micro-channels, also referred to herein as cooling channels. For industrial sized power generating turbine components, "small" or "micro" channel dimensions would encompass approximate depths and widths in the range of 0.25 mm to 1.5 mm, while for aviation sized turbine components channel dimensions would encompass approximate depths and widths in the range of 0.1 mm to 0.5 mm. A cooling fluid may be provided to the channels from a plenum, and the cooling fluid may flow through the channels, cooling the hot gas path component.

Referring now to FIG. 2, illustrated is an example of a hot gas component 30 having an airfoil configuration. As indicated, the component 30 comprises a substrate 32 with an outer surface 34 and an inner surface 36. The inner surface 36 of the substrate 32 defines at least one hollow, interior space 38. In an alternate embodiment, in lieu of a hollow interior space, the hot gas component 30 may include a supply cavity. A coating 42 is disposed over at least a portion of the outer surface 34 of the substrate 32. Defined within the coating 42 are one or more cooling channels 40. Each of the cooling channels 40 extends at least partially within the coating 42 and in fluidic communication via one or more cooling supply holes 43 with the at least one hollow, interior space 38. The cooling supply holes 42 are configured as discrete openings and do not run the length of the respective cooling channels 40. The coating 42 is disposed over at least a portion of the outer surface 34 of the substrate 32, and has defined therein the one or more grooves 44, that in combination with the substrate 32 and the at least one additional coating 50 form the cooling channels 40.

As described below, the method disclosed herein includes deposition and machining techniques to create a three-dimensional finished component 30, and more particularly the airfoil, including a plurality of cooling channels 40. The method may result in a component 30 that includes near transpiration cooling without the necessity of using porous materials of diminished strength. The cooling channels 40 may be arbitrary, or specifically targeted for location and size, and as such flexible in design. Re-entrant shaped cooling channels typically utilized to minimize deposition of the coating within the channel structure are not required, resulting in a decrease in machining time and relaxation of design tolerances. In addition, repair of the component 30 is easier, both in recovering mistakes on new part manufacture and in full repair.

As previously indicated, an exemplary embodiment fabricated according to the method disclosed herein is the fabrication of a gas turbine airfoil, including an interior hollow passageway in fluidic communication with a plurality of cooling channels formed within a coating disposed on a substrate of the component.

A method of manufacturing the component 30 is described with reference to FIGS. 3-11. As indicated for example in FIG. 3, the manufacturing method includes depositing a coating 42, also referred to herein as a structural coating, on the outer surface 34 of the substrate 32. In an embodiment, subsequent to deposition, the coating material 42 is heat treated. In an embodiment, the coating material 42 is fabricated to a depth of approximately 0.030", although it should be understood that the thickness of the coating 42 is design dependent and dictated by desired resulting cooling feature size. As shown in FIG. 4, the manufacturing method includes forming one or more grooves 44 (which partially define the channels 40 in FIG. 2) in the coating 42 deposited on the outer surface 34 of the substrate 32. The one or more grooves 44 may be formed by machining to selectively remove the coating 42 in one or more vertical and horizontal directions, without penetrating into the substrate 32. In an alternate embodiment, the one or more grooves 44 may be machined in the coating 42 and at least partially into the substrate 32 prior to further processing of the coating 42. Patterns may be formed in a grid-like manner or in any arbitrary geometry, including curved grooves, as long as dimensional requirements are maintained. As indicated, for example, in FIGS. 4 and 9, each groove 44 extends at least partially along the coating 42.

As best illustrated in FIGS. 5A, 5B and 9, one or more cooling supply holes 43 connect the one or more grooves 44 to the respective interior spaces 38. As shown in FIG. 2, the substrate 32 has at least one interior space 38 (FIG. 2). It should be noted that the cooling supply holes 43, shown in FIG. 9, are discrete holes located in the cross-section shown and do not extend through the substrate 32 along the length of the one or more grooves 44. The cooling supply holes 43 may be machined anywhere and in any desired pattern connecting the one or more grooves 44 to the respective interior spaces 38. The supply cooling holes 43 may be formed at normal angle relevant to the local surface, such as the outer surface 34 of the substrate 32, as best illustrated in FIG. 5A or at an acute angle to the local surface, such as the outer surface 34 of the substrate 32, as best illustrated in FIG. 5B. In an embodiment the supply cooling holes 43 may be machined through the remaining applied coating features, and more particularly through at least a portion of the coating 42.

The substrate 32 is typically a cast structure, as discussed in U.S. Pat. No. 5,626,462, Melvin R. Jackson et al., "Double-wall airfoil," which is incorporated herein in its entirety. The substrate 32 may be formed from any suitable material. Depending on the intended application for component 30, this could include Ni-base, Co-base and Fe-base superalloys. The Ni-base superalloys may be those containing both $\gamma$ and $\gamma'$phases, particularly those Ni-base superalloys containing both $\gamma$ and $\gamma'$ phases wherein the $\gamma'$ phase occupies at least 40% by volume of the superalloy. Such alloys are known to be advantageous because of a combination of desirable properties including high temperature strength and high temperature creep resistance. The substrate material may also comprise a NiAl intermetallic alloy, as these alloys are also known to possess a combination of superior properties including high-temperature strength and high temperature creep resistance that are advantageous for use in turbine engine applications used for aircraft. In the case of Nb-base alloys, coated Nb-base alloys having superior oxidation resistance will be preferred, particularly those alloys comprising Nb-(27-40)Ti-(4.5-10.5)Al-(4.5-7.9)Cr-(1.5-5.5)Hf-(0-6)V, where the composition ranges are in atom per cent. The substrate material may also comprise a Nb-base alloy that contains at least one secondary phase, such as a Nb-containing intermetallic compound comprising a silicide, carbide or boride. Such alloys are composites of a ductile phase (i.e., the Nb-base alloy) and a strengthening phase (i.e., a Nb-containing intermetallic compound). For other arrangements, the substrate material comprises a molybdenum based alloy, such as alloys based on molybdenum (solid solution) with $Mo_5SiB_2$ and/or $Mo_3Si$ second phases. For other configurations, the substrate material comprises a ceramic matrix composite (CMC), such as a silicon carbide (SiC) matrix reinforced with SiC fibers. For other configurations the substrate material comprises a TiAl-based intermetallic compound.

The coating 42 may be applied or deposited using a variety of techniques. For particular processes, the coating 42 may be deposited by performing ion plasma deposition (also known in the art as cathodic arc deposition). Example ion plasma deposition apparatus and method are provided in commonly assigned, U.S. Pat. No. 7,879,203, Weaver et al., "Method and Apparatus for Cathodic Arc Ion Plasma Deposition," which is incorporated by reference herein in its entirety. Briefly, ion plasma deposition comprises placing a consumable cathode having a composition to produce the desired coating material within a vacuum chamber, providing the substrate within the vacuum environment, supplying a current to the cathode to form a cathodic arc upon a cathode surface resulting in arc-induced erosion of coating material from the cathode surface, and depositing the coating material from the cathode upon the outer surface of the substrate.

Non-limiting examples of a coating deposited using ion plasma deposition are described in U.S. Pat. No. 5,626,462. For certain hot gas path components, the coating comprises a nickel-based or cobalt-based alloy, and more particularly comprises a superalloy or a (Ni,Co)CrAlY alloy. Where the substrate material is a Ni-base superalloy containing both $\gamma$ and $\gamma'$ phases, coating may comprise similar compositions of materials, as discussed in U.S. Pat. No. 5,626,462. Additionally, for superalloys the coating may comprise compositions based on the $\gamma'$-$Ni_3Al$ family of alloys.

For other process configurations, the coating 42 is deposited by performing at least one of a thermal spray process and a cold spray process. For example, the thermal spray process may comprise combustion spraying or plasma spraying, the combustion spraying may comprise high velocity oxygen fuel spraying (HVOF) or high velocity air fuel spraying (HVAF), and the plasma spraying may comprise atmospheric (such as air or inert gas) plasma spray, or low pressure plasma spray (LPPS, which is also known as vacuum plasma spray or VPS). In one non-limiting example, a (Ni,Co)CrAlY coating is deposited by HVOF or HVAF. Other example techniques for depositing the coating 42 include, without limitation, sputtering, electron beam physical vapor deposition, entrapment plating, and electroplating.

The one or more grooves 44 may be configured having any of a number of different shapes. For the example configuration shown in FIGS. 4-11, the one or more grooves 44 are substantially rectangular in cross-section. Although shown as having straight walls, the one or more grooves 44 may have any wall configuration, for example, they may be straight or curved.

The one or more grooves 44 may be formed using a variety of techniques. Example techniques for forming the one or more grooves 44 include an abrasive liquid jet, plunge electrochemical machining (ECM), electric discharge machining (EDM) with a spinning electrode (milling EDM), and/or laser machining Example laser machining techniques are described in commonly assigned, U.S. Publication No. 2011/0185572, B. Wei et al., "Process and System for Forming Shaped Air Holes", which is incorporated by reference herein in its entirety. Example EDM techniques are described in commonly assigned U.S. Patent Publication No. 2011/0293423, R. Bunker et al., "Articles Which Include Chevron Film Cooling Holes and Related Processes," which is incorporated by reference herein in its entirety.

For particular processes, the one or more grooves 44 and cooling supply holes 43 are formed using an abrasive liquid jet 41 (FIGS. 4 and 5A/5B). Example abrasive liquid jet drilling processes and systems are additionally provided in U.S. Publication No. 2011/0293423. As explained in U.S. Publication No. 2011/0293423, the abrasive liquid jet process typically utilizes a high-velocity stream of abrasive particles (e.g., abrasive "grit"), suspended in a stream of high pressure water. The pressure of the liquid may vary considerably, but is often in the range of about 35-620 MPa. A number of abrasive materials can be used, such as garnet, aluminum oxide, silicon carbide, and glass beads. Beneficially, the capability of abrasive liquid jet machining techniques facilitates the removal of material in stages to varying depths and with control over the shape of the machined features. This allows the one or more interior cooling supply holes 43 that supply the one or more channels 40 to be drilled either as a straight hole of constant cross section, a shaped hole (e.g., elliptical), or a converging or diverging hole (not shown).

In addition, and as explained in U.S. Publication No. 2011/0293423, the water jet system may include a multi-axis computer numerically controlled (CNC) unit (not shown). The CNC systems themselves are known in the art, and described, for example, in U.S. Pat. No. 7,351,290, S. Rutkowski et al., "Robotic Pen", which is incorporated herein by reference in its entirety. CNC systems allow movement of the cutting tool along a number of X, Y, and Z axes, as well as the tilt axes.

For the example depicted in FIGS. 3-11, the manufacturing method further includes processing at least a portion of a surface 46 of the coating 42 to plastically deform the coating 42 at least in a vicinity of a top of a respective groove 44. The resulting processed coating 42 is shown, for example, in FIGS. 6 and 7. A gap 48 present across the top of the groove 44 is reduced as a result of the processing, as indicated in FIG. 6, for example. Thus, processing the surface 46, affects a permanent deformation of the coating material 42. Beneficially, by reducing the gap 48 across the top of the groove 44, the manufacturing method improves the ability of one or more additional deposited coatings to bridge the opening directly (that is, without the use of a sacrificial filler), as indicated in FIGS. 7 and 8A/8B, for example. In addition, by reducing the gap 48 across the top of the groove 44, the manufacturing method facilitates the use of a less stringent machining specification for the width across the top of the groove 44. Beneficially, by reducing this machining specification, the manufacturing method may reduce the machining cost for the channels. Additionally, by plastically deforming the coating 42, localized plastic deformation of the substrate 32, which can lead to undesired recrystallization of the structural superalloy substrate, may be reduced or prevented.

As previously indicated, the manufacturing method may further optionally include preheating the substrate 32 prior to or during the deposition of the coating 42. Further, the manufacturing method may further optionally include heat treating (for example vacuum heat treating at 1100° C. for two hours) the component 30 after the coating 42 has been deposited and prior to processing the surface of the coating 42 as described with regard to FIG. 6. Thus, the step of processing the surface 46 of the coating 42 can be pre- or post-heat treatment. These heat treating options may improve the adhesion of the coating 42 to the substrate 32 and/or increase the ductility of the coating 42, both facilitating the processing of the coated substrate 32 so as to plastically deform the coating 42 and reduce the gap 48 across the top of the groove 44. In addition, the manufacturing method may further optionally include performing one or more grit blast operations. For example, the substrate surface 32 may optionally be grit blast prior to applying the coating 42. In addition, the processed coating surface 46 may optionally be subjected to a grit blast, so as to improve the adherence of a subsequently deposited additional coating (described presently). Grit blast operations would typically be performed after heat treatment, rather than immediately prior to heat treatment.

Commonly assigned U.S. patent application Ser. No. 13/242,179, R. Bunker et al., "Components with Cooling Channels and Methods of Manufacture", filed Sep. 23, 2011, applies similar processing to the substrate 32. However, by processing the coating 42, the above described method is advantageous, in that the coating 42 may be more ductile than the substrate 32 and therefore more amenable to plastic deformation. In addition, defects induced in the coating 42 by the deformation process will affect a lower mechanical debit of the coated component and may be healed more readily than those in the substrate 32 during subsequent heat treatment. The system having a coating 42 can therefore be deformed to a greater degree using the above-described method than can the uncoated substrate using the method of U.S. patent application Ser. No. 13/242,179. In addition, by limiting the deformation to the coating 42 only, this may also avoid recrystallization of the substrate 32 (relative to the method of U.S. patent application Ser. No. 13/242,179), leading to improved mechanical properties under cyclic loading.

Although not expressly shown, for particular applications, the processing of the surface 46 of coating 42 reduces the gap 48 in the coating 42 in the vicinity of the top of the groove 44. As used here, "reduces the gap" means that the gap width after processing is less than that before processing. For particular configurations, the processing may geometrically close the opening, where "geometrically closed" means the coating 42 is brought in close proximity with coating 42 from the opposing side of the groove opening substantially closing the gap 48. Thus, as used here, being geometrically closed is not equivalent to being metallurgically bonded. However, for certain process configurations, a metallurgical bond may in fact form. Beneficially, reducing the size of the gap 48, further improves the ability of one or more additional deposited coatings to bridge the opening directly.

The surface 46 of the coating 42 may be processed using one or more of a variety of techniques, including without limitation, shot peening the surface 46, water jet peening the surface 46, flapper peening the surface 46, gravity peening the surface 46, ultrasonic peening the surface 46, burnishing the surface 46, low-plasticity burnishing the surface 46, and laser shock peening the surface 46, to plastically deform the coating 42 (and possibly also a portion of the substrate 32) at least in the vicinity of the groove 44, such that the gap 48 across the top of the groove 44 is reduced.

For particular processes, the surface 46 of the coating 42 is processed by shot peening. As indicated in FIG. 6, for example, shot peening typically introduces a number of surface irregularities 45 in the surface 46 of the coating 42. During the peening process, the cooling pattern dimensions, and more particularly a dimension of each of the gaps 48 across the one or more grooves 44, must be less than the shot diameter. It is anticipated, in an embodiment, to maintain differing regions of size on the part, differing shot sizes for peening may be utilized. Beneficially, the surface irregularities may aid in the bridging of one or more additional coatings deposited over the surface 46, and especially coatings deposited using processes, such as ion plasma deposition, electron beam physical vapor deposition, and sputtering.

For other processes, the surface 46 of the coating 42 may be processed by burnishing. A variety of burnishing techniques may be employed, depending on the material being surface treated and on the desired deformation. Non-limiting examples of burnishing techniques include plastically massaging the surface 46 of the coating 42, for example using rollers, pins, or balls, and low plasticity burnishing.

The gap 48 across the top of each of the one or more grooves 44 will vary based on the specific application. However, for certain configurations, the gap 48 across the top of each of the one or more grooves 44 is in a range of about 8-40 mil (0.2-1.0 mm) prior to processing the surface 46 of the coating 42, and the gap 48 across the top of each of the one or more grooves 44 is in a range of about 0-15 mil (0-0.4 mm) after processing the surface 46 of the coating 42.

For particular configurations, the step of processing the surface 46 of the coating 42 deforms the coating surface 46, such as "mushrooms" the coating 42 so as to form "facets", in the vicinity of each of the one or more grooves 44. As used herein, "faceting" should be understood to tilt the surface 46 in the vicinity of the groove 44 toward the groove 44, as indicated, for example, in the circled region in FIG. 6.

As indicated, for example, in FIGS. 7 and 10, the manufacturing method further includes disposing an additional coating 50 over at least a portion of the surface 46 of the coating 42 to provide bridging of the gap 48. It should be noted that this additional coating 50 may comprise one or more different coating layers. For example, the coating 50 may include an additional structural coating and/or optional additional coating layer(s), such as bond coatings, thermal barrier coatings (TBCs) and oxidation-resistant coatings. For particular configurations, the additional coating 50 comprises an outer structural coating layer. As indicated, for example, in FIG. 7, the substrate 32, the coating 42 and the additional coating 50 define each of the one or more cooling channels 40 for cooling the component 30.

For particular configurations, the coating 42 and additional coating 50 have a combined thickness in the range of 0.1-2.0 millimeters, and more particularly, in the range of 0.2 to 1 millimeter, and still more particularly 0.2 to 0.5 millimeters for industrial components. For aviation components, this range is typically 0.1 to 0.25 millimeters. However, other thicknesses may be utilized depending on the requirements for a particular component 30.

The additional coating layer(s) 50 may be deposited using a variety of techniques. Example deposition techniques for forming coatings are provided above. In addition to structural coatings, bond coatings, TBCs and oxidation-resistant coatings may also be deposited using the above-noted techniques.

For certain configurations, it is desirable to employ multiple deposition techniques for depositing the coating 42 and the additional coating 50. For example, a first coating 42 may be deposited using an ion plasma deposition, and a subsequently deposited additional coating layer may be deposited using other techniques, such as a combustion thermal spray process or a plasma spray process. Depending on the materials used, the use of different deposition techniques for the coating layers may provide benefits in properties, such as, but not restricted to: strain tolerance, strength, adhesion, and/or ductility.

As indicated in FIGS. 8A and 8B, subsequent to the deposition of the coating 50 (and any other coatings such as ceramic coatings are applied), to complete the cooling pattern, one or more cooling holes 54 may be machined through the top coatings, including the additional coating 50 (and any subsequently deposited coatings) again in any locations and pattern desired as long as the one or more cooling holes 54 provide fluid communication with the cooling pattern, and more particularly for the one or more cooling channels 40. The one or more cooling holes 54 may again be normal to a local surface (as previously described), as best illustrated in FIG. 8A, or angled, include shaping etc. As needed, a portion 56 of the one or more cooling holes 54 may also be machined through the substrate 32, as best illustrated in FIG. 8B, to communicate directly with the interior region 38 of the component 30.

Referring now to FIG. 11, illustrated is a flow chart depicting one implementation of a method 60 of making a component 30 including one or more cooling channels 40 according to one or more embodiments shown or described herein. The method 60 includes manufacturing the component 30 to ultimately include one or more cooling channels 40 by initially providing a substrate 32 and depositing on an outermost surface 34 a coating 42, at step 62. The coating 42 may optionally be heat treated prior to further processing steps. Next, at step 64, the coating 42 is machined to selectively remove the coating 42 in one or more vertical and horizontal directions, to define the one or more grooves 44, into the coating 42 without penetrating into the substrate 32. The machining of patterns may be configured in a grid-like geometry or in any arbitrary geometry, including a curved geometry, as long as dimensional requirements are maintained. The one or more cooling supply holes 43 are next defined in the substrate 32 in a machining step 66. The one or more cooling supply holes 43 are provided in fluidic communication with the interior space 38. The surface 46 of the coating 42 is next treated, such as in a shot peening process step 68, to deform, and more particularly, "mushroom" the surface 46 of the coating 42 and narrow the gap 48 of the one or more grooves 44. An additional coating 50 is next deposited, in a step 70, on the treated surface 46 of the coating 42 to close the gap and define the one or more cooling channels 40. Finally, in a step 72, one or more cooling holes 54 are machined in the coating 50. The one or more cooling holes 54 are machined in any locations and pattern in the coating 50 to provide fluid communication with the cooling pattern. After processing, provided is the component 30 including the interior space passageway 38, the one or more cooling supply holes 43 in fluidic communication with the interior passageway 38 and one or more cooling channels 40 formed in a coating 42 in fluidic communication with the one or more cooling supply holes 43. It should be understood that the cooling holes 48 can take on many alternate forms, including exit trenches that may connect the cooling exits of several cooling channels. Exit trenches are described in commonly assigned U.S. Patent Publication No. 2011/0145371, R. Bunker et al., "Components with Cooling Channels and Methods of Manufacture," which is incorporated by reference herein in its entirety.

Beneficially, the above described manufacturing methods can affect complete or partial closure of the gap 48 in each of the one or more grooves 44 formed in the coating 42 by processing the surface 46 of the coating 42, so as to plastically deform it. This, in turn, facilitates bridging of the gap 48 by the additional coating 50. The resulting finished component 30 may thus show no signs of: the microchannels, visual cracks, or gaps. This provides a more uniform coating in terms of micro-structure and strength when applied over a processed coating.

Although only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. A manufacturing method comprising:
    providing a substrate with an outer surface and at least one interior space;
    applying a coating on at least a portion of the substrate;
    forming one or more grooves only within the coating wherein each groove extends at least partially along an outer surface of the substrate and has a base, a top and a gap present across the top of the groove;
    forming one or more cooling supply holes through the base of a respective groove wherein each of the one or more cooling supply holes is formed at a 45° to 90° angle relative to the base of a respective groove, to connect the groove in fluid communication with the respective interior space;
    processing at least a portion of a surface of the coating so as to plastically deform the coating at least in a vicinity of the top of a respective groove, such that a gap across the top of the groove is reduced; and
    applying one or more additional coatings over at least a portion of the surface of the coating, wherein the substrate, the coating and the additional coating define one or more enclosed channels for cooling a component.

2. The manufacturing method of claim 1, wherein the step of forming one or more grooves further comprises forming at least a portion of the one or more grooves in a portion of the substrate.

3. The manufacturing method of claim 1, wherein each groove is formed using one or more of an abrasive liquid jet, plunge electrochemical machining (ECM), electric discharge machining (EDM) with a spinning electrode (milling EDM), and laser machining.

4. The manufacturing method of claim 1, wherein processing the surface of the coating comprises performing one or more of shot peening the surface, water jet peening the surface, flapper peening the surface, gravity peening the surface, ultrasonic peening the surface, burnishing the surface, low plasticity burnishing the surface, and laser shock peening the surface, to plastically deform the coating at least in the vicinity of the groove.

5. The manufacturing method of claim 4, wherein the processing introduces a plurality of surface irregularities in the surface of the coating.

6. The manufacturing method of claim 4, wherein processing the surface of the coating comprises shot peening the surface.

7. The manufacturing method of claim 6, wherein shot peening the surface includes peening particles having a diameter greater than the gap across the top of the one or more grooves.

8. The manufacturing method of claim 1, wherein the gap across the top of the groove is in a range of about 0.2-1.0 mm prior to processing the surface of the coating, and wherein the gap across the top of the groove is in a range of about 0-0.4 mm after the surface of the coating has been processed.

9. The manufacturing method of claim 1, wherein the additional coating comprises one or more of an outer structural coating layer, a bond coating and a thermal barrier coating.

10. The manufacturing method of claim 1, wherein the additional coating comprises an outer structural coating layer.

11. The manufacturing method of claim 1, wherein the step of processing the surface of the coating facets the coating in a vicinity of the groove.

12. A manufacturing method comprising:
    providing a substrate with an outer surface and at least one interior space;
    applying a structural coating on at least a portion of the substrate;
    forming one or more grooves only within the structural coating wherein each groove extends at least partially along an outer surface of the substrate and has a base and a top and a gap present across the top of the groove;
    forming one or more cooling supply holes through the base of a respective groove, wherein each of the one or more cooling supply holes is formed at a 45° to 90° angle relative to the base of a respective groove to connect the groove in fluid communication with the respective interior space;
    processing at least a portion of a surface of the structural coating so as to plastically deform the structural coating at least in a vicinity of the top of a respective groove and facet the surface of the structural coating in a vicinity of the groove, such that a gap across the top of the groove is reduced; and applying one or more additional coatings over at least a portion of the surface of the structural coating, wherein the substrate, the structural coating and the additional coating define one or more enclosed channels for cooling a component.

13. The manufacturing method of claim 12, wherein the step of forming one or more grooves further comprises forming at least a portion of the one or more grooves in a portion of the substrate.

14. The manufacturing method of claim 12, wherein processing the surface of the structural coating comprises performing one or more of shot peening the surface, water jet peening the surface, flapper peening the surface, gravity peening the surface, ultrasonic peening the surface, burnishing the surface, low plasticity burnishing the surface, and laser shock peening the surface, so as to deform the coating at least in a vicinity of the top of a respective groove and facet the surface of the structural coating adjacent at least one edge of the groove.

15. The manufacturing method of claim 14, wherein processing the surface of the structural coating comprises shot peening the surface, and wherein the shot peening introduces a plurality of surface irregularities in the surface of the structural coating.

16. The manufacturing method of claim 15, wherein shot peening the surface includes peening particles having a diameter greater than the gap across the top of each of the one or more grooves.

17. The manufacturing method of claim 12, wherein the additional coating comprises one or more of an outer structural coating layer, a bond coating and a thermal barrier coating.

* * * * *